United States Patent [19]

Burdick

[11] 4,103,249

[45] Jul. 25, 1978

[54] PNP CURRENT MIRROR

[75] Inventor: Kenneth John Burdick, Trumansburg, N.Y.

[73] Assignee: GTE Sylvania Incorporated, Stamford, Conn.

[21] Appl. No.: 846,834

[22] Filed: Oct. 31, 1977

[51] Int. Cl.[2] .................. H03F 3/18

[52] U.S. Cl. .................. 330/288; 307/297; 323/4; 330/289

[58] Field of Search .................. 330/257, 288, 289; 307/297; 323/4

[56] References Cited

U.S. PATENT DOCUMENTS 3,909,628 9/1975 Muto .................. 307/297

*Primary Examiner*—James B. Mullins

*Attorney, Agent, or Firm*—Theodore D. Lindgren

[57] ABSTRACT

A controlled current source circuit using PNP mirror transistors and having wide frequency bandwidth as well as correction for D.C. offset, said circuit comprised of first and second PNP transistors, one of which is connected as a diode, the base terminals of which are commonly connected, the collector terminals of each of which are connected respectively to first and second terminals of a current bias means providing control of emitter-base characteristics and correction for offset caused by base currents, the emitter terminals of which are each connected respectively to first and second resistors, the resistors connected to common potential source, wherein mirror currents are tapped from the connections between the emitter terminals and the resistors and wherein the output mirror current is the collector current of an NPN transistor, the base and collector terminals of which are respectively connected to the collector and emitter terminals of the second PNP transistor.

7 Claims, 3 Drawing Figures

PNP CURRENT MIRROR

FIELD OF THE INVENTION

This invention is related to controlled current source circuits, commonly referred to as current mirror circuits.

BACKGROUND OF THE INVENTION

The basic form of controlled current source consists of an input transistor which is connected as a diode and of a usually identical output transistor with base and emitter terminals connected to the base and emitter terminals of the input transistor. During operation, the emitter terminals are both connected to a source of potential and the current through the collector of the output transistor is controlled by current applied to the common collector-base terminal connection of the input transistor. Input and output transistors are both of the NPN type or both of the PNP type. Therefore, the input and output currents both flow into the device or both flow out of the device in essentially a mirror image of each other. However, even when using identical transistors the D.C. input current differs in magnitude from the D.C. output current by the sum of the base currents of the transistors and the A.C. input current varies in both magnitude and phase from the A.C. output current because of the inherent parasitic and transit-time degradation.

Numerous improvements to the basic form of current controlled source have been proposed or embodied. Among the improvements are the so-called Wilson source, various cascade circuit arrangements and numerous circuit designs for supplying the base currents from sources other than the input current. Such improvements have not, in the majority of cases, resulted in improvement of frequency performance over that of the basic current mirror.

Current mirrors are commonly used in the design and fabrication of integrated circuits because of the inherently limited space requirements and the consequent necessity for elimination of large capacitance and resistance values from such circuits. Design preference is given to current mirrors fabricated using NPN transistors because of the vertical structure of the manufactured NPN transistor elements and the resultant large current gain and short transit time. However, where design requirements dictate use of PNP current mirrors and where cost factors prohibit use of fabrication techniques other than the conventional lateral structure of PNP transistor elements, compensation must be made for the low gain, the long transit time and the large value base currents. The circuit of this invention utilizes an unconventional method for deriving mirror currents and provides means for compensation and minimization of errors in offset, magnitude and phase between input and output currents.

SUMMARY OF THE INVENTION

The emitter terminals of two PNP transistors are each connected to one terminal of each of two ratio-valued resistors. One of the transistors is connected as a diode and the base terminals of the transistors are commonly connected. The collectors of the two transistors are each coupled to a current bias means providing two sources of current, one for each of said transistors. The other terminal of each of the two ratio-valued resistors is connected to a common source of D.C. potential. Ratioed mirror currents are tapped from each of the connections between the emitter terminals of the transistors and the first terminals of the ratio-valued resistors, the large impedance output mirror current supplied through an NPN transistor. The two sources of D.C. current established by a current bias means may have relative fixed values being such that the base-emitter junction currents and voltages of the two transistors are also identical, thereby substantially eliminating D.C. offset between mirror currents. An embodiment for a current bias means is disclosed which supplies currents with a proper ratio relationship, corrected for bias current offset.

DESCRIPTION OF THE PREFERRED EMBODIMENT

For a better understanding of the present invention, together with other and further objects, advantages and capabilities thereof, reference is made to the following disclosure in conjunction with the accompanying drawings.

Figure 1:
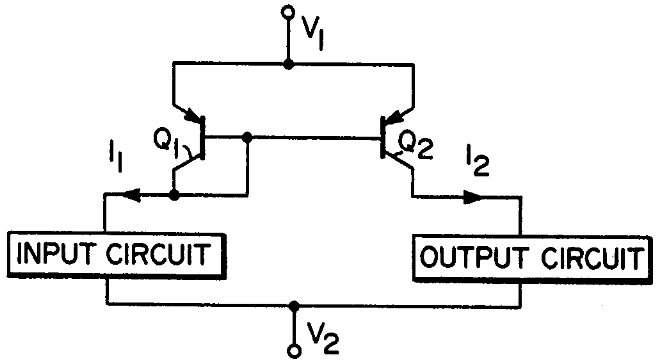
Fig. 1 PRIOR ART
FIG. 1 indicates the basic prior art version of a PNP current mirror.

Referring to the drawings, wherein similar elements are designated using the same symbols in both figures, FIG. 1 illustrates a prior art form of PNP current mirror. The emitter-base junction of first transistor $Q_1$ is connected in parallel with the emitter-base junction of second transistor $Q_2$. Transistor $Q_1$ is connected as a diode. If $Q_1$ and $Q_2$ are identical transistors, as is the usual design as well as result when using integrated circuit fabrication techniques, the ratio of $I_1$ to $I_2$ can be easily calculated to be $\beta + 2$ to $\beta$ where $\beta$ is the commonly used ratio all collector current to base current with no variation of collector-emitter voltage. For large values of $\beta$, such as those resulting from the vertical structure used for fabrication of integrated circuit NPN transistors, the ratio of $I_1$ to $I_2$ is close to unity. However, the values of $\beta$ resulting from the lateral structure commonly used for PNP transistors range from 5 to 15, resulting in a non-unity ratio of $I_1$ to $I_2$. In addition, the bandwidth of frequency response of the PNP current mirror is very narrow because of the loss of signal transmission through parasitic capacitance and excessive transit time.

Figure 2:
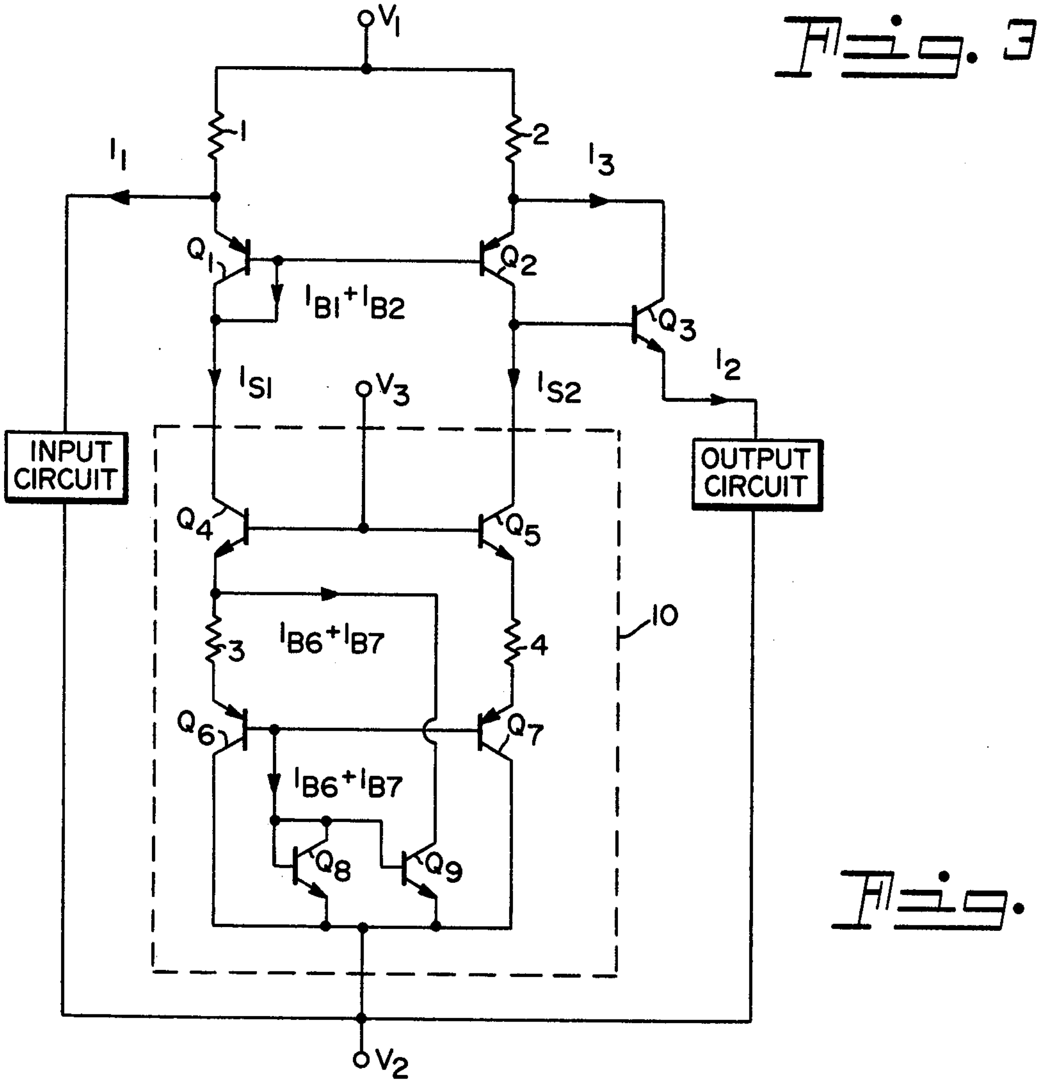
FIG. 2 indicates a preferred embodiment of the PNP current mirror circuit of this invention.

FIG. 2 illustrates a preferred embodiment of this invention. Input and output terminals are labeled $I_1$ and $I_2$ respectively. Transistors $Q_1$, $Q_2$ and $Q_3$ as well as resistors 1 and 2 and current bias means 10 comprises the mirror circuit. Sources of constant or D.C. potential, $V_1$, $V_2$ and $V_3$ (not shown) are indicated and have a relationship such that $V_1 > V_3 > V_2$. One of said D.C. potential sources may be a ground or reference potential.

First and second resistors 1 and 2 are usually simultaneously formed during fabrication and, for unity relation between $I_1$ and $I_2$ have identical values. A first terminal of each of said resistors is connected to a first D.C. potential source (not shown) having potential $V_1$. The second terminals of each of said resistors are connected respectively to the emitter terminals of usually identical first and second transistors $Q_1$ and $Q_2$. The base terminals of transistors $Q_1$ and $Q_2$ are commonly connected to a first common connection which is also connected to the collector terminal of first transistor $Q_1$. The collector terminals of transistors $Q_1$ and $Q_2$ are respectively connected to first and second terminals of bias current means 10 which controls D.C. currents $I_{s1}$ and $I_{s2}$ respectively flowing into said first and second terminals. Output transistor $Q_3$ is of NPN construction with collector terminal connected to the emitter terminal of transistor $Q_2$ and with base terminal connected to the collector terminal of transistor $Q_2$. An input circuit, labeled as such, is connected to the junction of resistor 1 and the emitter terminal of transistor $Q_1$. The input circuit is normally comprises of other sections of the integrated circuit and of circuitry connected to the inputs thereof. Current $I_1$, in general, has both D.C. and A.C. components. An output circuit, labeled as such, is connected to the emitter terminal of transistor $Q_3$ and may be comprised of other sections of the integrated circuit and of circuitry connected thereto. Input and output circuits are indicated as separate elements connected to a second source of D.C. potential having value $V_2$, although it is understood by those skilled in the applicable art that actual input and output circuits may not be completely separated and may, in fact, have components common to both. Input and output circuits may also, in general, be referenced to any source of D.C. potential having a fixed relationship to said first or second sources of D.C. potential.

Current bias means 10 causes D.C. current $I_{s1}$ to flow from said first common connection which includes the collector terminal of transistor $Q_1$ and the base terminals of transistors $Q_1$ and $Q_2$. Bias means 10 also causes D.C. current $I_{s2}$ to flow from the collector terminal of transistor $Q_2$, the base current of NPN transistor $Q_3$ being negligibly small in magnitude. For unity relation between input and output currents, currents $I_{s1}$ and $I_{s2}$ are made to differ in magnitude by substantially the value of the sum of the two base currents $I_{B1}$ and $I_{B2}$ respectively flowing from transistors $Q_1$ and $Q_2$, thereby causing the base-emitter current-voltage values of identical transistors $Q_1$ and $Q_2$ to be substantially identical.

The voltage across resistor 1 is substantially the same as the voltage across resistor 2, differing only by any difference in voltage across the base-emitter terminals of transistor $Q_1$ and $Q_2$, those voltage having been made substantially identical by choice of values for currents $I_{s1}$ and $I_{s2}$. Therefore, with identical values used in fabrication of resistors 1 and 2, currents $I_1$ and $I_3$ will be substantially identical. In further explanation, the relationship between $I_1$ and $I_3$ may be given by the equation, $$I_1R_1 - I_3R_2 = I_{e2}R_2 - I_{e1}R_1 + V_{eb2} - V_{eb1},$$

where $R_1$ and $R_2$ are the values of resistors 1 and 2, $I_{e1}$ and $I_{e2}$ are the emitter currents in transistors $Q_1$ and $Q_2$, $V_{eb1}$ and $V_{eb2}$ are the emitter-base voltages of $Q_1$ and $Q_2$. Using equal values for resistors 1 and 2 and using substantially identical biasing of $Q_1$ and $Q_2$ results in cancellation of all of the terms on the right side of the equation, thus making $I_1$ and $I_3$ equal. The above equation does not, of course, include terms to account for A.C. Differences between $I_1$ and $I_3$ caused by parasitic and and transit-time phenomena.

The output current $I_2$ is substantially equal to $I_3$, the collector current of NPN transistor $Q_3$. Transistors $Q_2$ and $Q_3$ form a composite transistor with NPN transistor $Q_3$ compensating for the low gain of PNP transistor $Q_2$ while at the same time providing a high impedance current-controlled source for current $I_2$. In an embodiment with equal resistors 1 and 2, current $I_2$ is, therefore, substantially equal to current $I_1$ over a wide bandwidth of frequencies, there being no D.C. offset if resistors 1 and 2 are equal and if bias currents $I_{s1}$ and $I_{s2}$ are properly selected.

Current bias means 10 may be comprised of first and second NPN transistors $Q_4$ and $Q_5$ having collector terminals respectively connected to first and second terminals drawing currents $I_{s1}$ and $I_{s2}$, base terminals both connected to a second common connection and to third potential source $V_3$ (not shown) and emitter terminals connected to first terminals of third and fourth resistors 3 and 4 respectively. Second terminals of resistors 3 and 4 are connected to the emitter terminals of third and fourth PNP transistors $Q_6$ and $Q_7$, which are normally simultaneously fabricated to be identical with PNP transistors $Q_1$ and $Q_2$. The base terminals of transistors $Q_6$ and $Q_7$ are both connected to a third common connection which includes the collector-base terminals of diode-connected third NPN transistor $Q_8$. The collector terminals of transistors $Q_6$ and $Q_7$ as well as the emitter terminal of transistor $Q_8$ are connected to a third terminal of the current bias means which is, in turn, connected to D.C. potential source $V_2$. Third and fourth NPN transistors $Q_8$ and $Q_9$ form an NPN current mirror, the base-emitter terminals of transistor $Q_9$ being connected in parallel with the base-emitter terminals of transistor $Q_8$. The collector terminal of transistor $Q_9$ is connected to the emitter terminal of transistor $Q_4$.

Where it is desired that the magnitudes of currents $I_1$ and $I_2$ have a unity ratio, resistors 3 and 4 are simultaneously fabricated to have identical values and the current flowing through each of said resistors is essentially determined by difference in potential between sources $V_2$ and $V_3$ (neglecting the emitter-base voltages of transistors $Q_4$, $Q_5$, $Q_6$, $Q_7$ and $Q_8$.) Assuming NPN transistors $Q_4$, $Q_5$, $Q_8$ and $Q_9$ to have high current gain and consequently negligible base currents, currents $I_{s1}$ and $I_{s2}$ are equal to the respective currents through resistors 4 and 5 with the exception of that current flowing from the electrical connection of the emitter terminal of transistor $Q_4$ to the collector terminal of transistor $Q_9$. Because the collector currents of identical PNP transistors $Q_1$, $Q_2$, $Q_3$ and $Q_4$ are essentially identical, being fixed by the voltage across identical resistors 3 and 4, the base currents $I_{B1}$, $I_{B2}$, $I_{B6}$ and $I_{B7}$, flowing out of each of said transistors will normally be identical. The base currents $I_{B6}$ and $I_{B7}$ from transistors $Q_6$ and $Q_7$ are added at the electrical connection with the input to the current mirror comprises of transistors $Q_8$ and $Q_9$. The output of said current mirror, $I_{B6} + I_{B7}$, is added to the current through resistor 3 at the electrical connection to the emitter of transistor $Q_4$. As a result, $I_{s1}$ and $I_{s2}$ differ by the sum $I_{B6} + I_{B7}$ (which is equal to $I_{B1} + I_{B2}$), therefore providing biasing to transistors $Q_1$ and $Q_2$ such that the base-emitter junctions are biased with substantially identical currents and voltages.

Current bias means 10 preferably should have a large magnitude output impedance in order to increase the bandwidth of the frequency response of the current mirror. In the embodiment illustrated, the output impedances of NPN transistors $Q_4$ and $Q_5$ provide the desirable large magnitude of impedance.

The current mirror of this invention may be used to provide non-unity current ratios between input and output currents by fabricating the desired non-unity current ratio between values of resistors 1 and 2 as well as between values of resistors 3 and 4. A similar analysis indicates that the sum of currents $I_{B6}$ and $I_{B7}$ is substantially equal to the sum of currents $I_{B1}$ and $I_{B2}$ providing that transistors $Q_1$ and $Q_6$ are substantially identical and that transistors $Q_2$ and $Q_7$ are substantially-identical. However, the preceding equation indicates a slight D.C. offset using the non-unity ratio resistors $R_1$ and $R_2$ caused by the difference between $V_{eb1}$ and $V_{eb2}$, the emitter-base voltages of identical transistors $Q_1$ and $Q_2$. If the circuit is designed such that those emitter-base voltages are small with respect to the voltage across resistors 1 and 2, the slight D.C. offset between input and output currents may be disregarded. The offset error may be substantially eliminated by equalizing the emitter-base voltages through fabrication such that emitter-base junction areas of substantially identical transistors $Q_1$ and $Q_6$ differ from the emitter-base junction areas of substantially identical transistors $Q_2$ and $Q_7$. Ideally, the ratio of the emitter-base junction areas of transistors $Q_1$ and $Q_6$ to the emitter-base junction areas of transistors $Q_2$ and $Q_7$ is equal to the ratio of the value of resistor 2 to the value of resistor 1, thus equalizing the current density through said junctions to result in equal junction voltages while at the same time providing correct base current compensation.

It is noted that operation of the circuit is not dependent on the absolute values of resistors 1, 2, 3 and 4 nor is operation dependent upon the absolute values of transistor parameters. In accordance with the preferred methods for linear integrated circuit design, operation of the circuit depends upon the fact that similar elements fabricated on a single chip generally have identical characteristics, and those identical characteristics may change with temperature and may be different from those of the same elements on other chips. It is also noted that, in the usual construction of the circuit using present technology, space limitations require that resistors 1, 2, 3 and 4 be in the range of hundreds of ohms.

Figure 3:
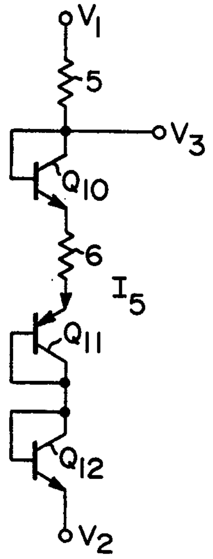
FIG. 3 indicates a circuit for providing a temperature-compensated source of D.C. potential, said circuit optionally used for the purpose of eliminating a connecting terminal from the circuit of FIG. 2.

The circuit of FIG. 3 is a temperature-compensated source of third D.C. voltage potential $V_3$ which may be used in conjunction with the current bias means of FIG. 2 to eliminate the separate connection required for that source. The current requirements of potential source $V_3$ are the base currents of NPN transistors $Q_4$ and $Q_5$, which are negligible. Current $I_5$ is essentially determined by the difference between the values of $V_1$ and $V_2$ divided by the sum of the values of fifth and sixth resistors 5 and 6. Transistors $Q_{10}$, $Q_{11}$, and $Q_{12}$ are connected as diodes, said diodes further connected in series with sixth resistor 6 to provide temperature compensation for changes in parameters of corresponding transistors $Q_5$, $Q_7$ and $Q_8$ and parallel-operating transistors. The circuit acts as a voltage divider which proportions the difference between potentials $V_1$ and $V_2$. Fifth resistor 5 is connected to potential source $V_1$ and the series combination of sixth resistor 6, NPN transistors $Q_{10}$ and $Q_{12}$ and PNP transistor $Q_{11}$ is connected to potential source $V_2$. Potential $V_3$ is tapped from a common junction of said fifth resistor 5 and said series combination.

While there has been described what is at present considered to be a preferred embodiment of the invention, it will be obvious to those skilled in the art that various changes and modifications such as use of coupling circuits or elements other than connections described may be made therein without departing from the invention as defined by the appended claims.

I claim:

1. A controlled current source circuit for connection between an input circuit and an output circuit comprising:
   first and second PNP transistors, each having an emitter-base junction, and each having a base terminal, an emitter terminal and a collector terminal, said base terminals connected to a first common connection, said collector terminal of said first transistor also connected to said first common connection;
   an NPN output transistor having a base terminal, an emitter terminal and a collector terminal, said base terminal connected to said collector terminal of said second PNP transistor, said collector terminal connected to said emitter terminal of said second PNP transistor;
   first and second resistors, the value of said first resistor having a ratio with respect to the value of said second resistor, said resistors each having first and second terminals, said first terminal of each of said first and second resistors connected to a first source of D.C. potential, said second terminal of each of said first and second resistors respectively connected to the emitter terminal of each of said first and second transistors;
   current bias means with a first terminal connected to said first common connection, with a second terminal connected to said collector terminal of said second transistor and with at least a third terminal connected to a second source of D.C. potential, the magnitude of current flowing through said second terminal having a fixed relationship with respect to the magnitude of current through said first terminal;
   said input circuit also connected to said emitter terminal of said first transistor and to at least one source of D.C. potential; and
   said output circuit connected to said emitter terminal of said output transistor and to at least one source of D.C. potential.

2. The controlled current source circuit of claim 1 in which said fixed relationship of said current bias means comprises a ratio relationship, said ratio relationship being substantially equal to the ratio between values of said first and second resistors.

3. The controlled current source of claim 1 in which said fixed relationship of said current bias means is such that said magnitude of current flowing through said first terminal is substantially equal to the sum of the magnitudes of the currents flowing through said base terminals of said first and second transistors and of the inverse of said ratio between values of said first and second resistors multiplied by said magnitude of current flowing through said second terminal.

4. The controlled current source circuit of claim 1 in which the size of the area of said emitter-base junction of said second PNP transistor has a ratio relationship to the size of the area of said emitter-base junction of said first PNP transistor, said ratio relationship being substantially equal to said ratio between values of said first and second resistors.

5. The controlled current source circuit of claim 3 in which said current bias means comprises:
   first and second NPN transistors each having a base terminal, an emitter terminal and a collector terminal, nal, said base terminals of said first and second NPN transistors connected to a second common connection, said collector terminal of said first NPN transistor connected to said first terminal of said current bias means, said collector terminal of said second NPN transistor connected to said second terminal of said current bias means, said second common connection connected to a third source of D.C. potential;

third and fourth resistors, the value of said third resistor having said ratio with respect to the value of said fourth resistor, said resistors each having first and second terminals, said first terminal of each of said third and fourth resistors respectively connected to the emitter terminal of each of said first and second NPN transistors;

third and fourth PNP transistors, each having an emitter-base junction, and each having a base terminal, an emitter terminal and a collector terminal, said emitter terminal of each of said third and fourth PNP transistors respectively connected to said second terminal of each of said third and fourth resistors, said base terminals of said third and fourth PNP transistors connected to a third common connection, said collector terminals of said third and fourth PNP transistors connected to said second source of D.C. potential; and third and fourth NPN transistors, each having a base terminal an emitter terminal and a collector terminal, said base terminals of said third and fourth NPN transistors connected to said third common connection, said collector of said third NPN transistor also connected to said third common connection, said collector terminal of said fourth NPN transistor also connected to said emitter terminal of said first NPN transistor and said emitter terminals of said third and fourth NPN transistors connected to said second source of D.C. potential.

6. The controlled current source circuit of claim 5 in which the size of the area of said emitter-base junction of said fourth PNP transistor has a ratio relationship to the size of the area of said emitter-base junction of said third PNP transistor, said ratio relationship being substantially equal to said ratio between values of said first and second resistors.

7. The controlled current source circuit of claim 5 in which said third source of D.C. potential is comprised of a fifth resistor and of a series combination of a sixth resistor, two diode-connected NPN transistors and a diode-connected PNP transistor, said fifth resistor connected to said first source of D.C. potential, said series combination connected to said second source of D.C. potential and said fifth resistor and said series combination further connected to a common junction, said junction furnishing said third source of D.C. potential.

* * * * *